United States Patent [19]
Stave et al.

[11] Patent Number: 6,002,623
[45] Date of Patent: *Dec. 14, 1999

[54] SEMICONDUCTOR MEMORY WITH TEST CIRCUIT

[75] Inventors: Eric Stave; Phillip G. Wald, both of Boise, Id.

[73] Assignee: Micron Technology, Inc., Boise, Id.

[ * ] Notice: This patent is subject to a terminal disclaimer.

[21] Appl. No.: 09/235,468

[22] Filed: Jan. 22, 1999

Related U.S. Application Data

[63] Continuation of application No. 08/957,888, Oct. 27, 1997, Pat. No. 5,892,720, which is a continuation of application No. 08/798,848, Nov. 4, 1997, Pat. No. 5,684,809.

[51] Int. Cl.⁶ ....................................................... G11C 7/00
[52] U.S. Cl. ............................................. 365/201; 365/190
[58] Field of Search ..................................... 365/201, 190

[56] References Cited

U.S. PATENT DOCUMENTS

5,241,501  8/1993  Tanaka ..................................... 365/201

*Primary Examiner*—David Nelms
*Assistant Examiner*—Hoai V. Ho
*Attorney, Agent, or Firm*—Schwegman, Lundberg, Woessner & Kluth P.A.

[57] ABSTRACT

A test circuit and method for a semiconductor memory array such as a dynamic random access memory (DRAM) or static random access memory (SRAM) array that reduces the required testing time. A row of memory cells is concurrently written to a logic level, then read. Any faulty memory cells will discharge both true and complementary data lines through a diode or a diode-connected FET. The resulting voltage on the data line is less than its precharged high logic level, allowing detection of any faulty memory cell in the row of memory cells.

23 Claims, 6 Drawing Sheets

SEMICONDUCTOR MEMORY WITH TEST CIRCUIT

This application is a continuation of U.S. Ser. No. 08/957,888 filed Oct. 27, 1997, now U.S. Pat. No. 5,892,720 which is a continuation of U.S. Ser. No. 08/798,848 which issued on Nov. 4, 1997 as U.S. Pat. No. 5,684,809.

THE FIELD OF THE INVENTION

The present invention relates to semiconductor integrated circuits and, more particularly, to fabrication of memory cell arrays including test circuits for use in rapidly testing the memory cell arrays.

BACKGROUND OF THE INVENTION

Semiconductor memory manufacturing technology allows the creation of high density memory arrays on an integrated circuit chip. Such memory arrays consist of many memory cells, each cell capable of storing one data bit. Dynamic random access memories (DRAMs) are manufactured with a storage capacity as high as 64 megabits. Static random access memories (SRAMs) are manufactured with a storage capacity as high as 4 megabits. Future technological advances are expected to further increase memory storage capacity.

By limiting the number of data bits in the memory cell array which can be accessed simultaneously (the bit width), the memory cell array density is increased, thereby increasing the storage capacity of the memory cell array. However, a smaller bit width increases the time required to test the memory array. For example, only one bit can be written into or read from a memory cell array having a bit width of one. To read and write both a "0" state and a "1" state, a 16 megabit memory having a single bit width must be accessed 64 million times. It is desirable to reduce the time required to test large memory arrays by reducing the number of times the array is accessed.

SUMMARY OF THE INVENTION

The present invention discloses a semiconductor memory having memory cells arranged in rows and columns. Each row of memory cells is accessed by one of a plurality of word lines. Each column of memory cells is accessed by one of a plurality of bit lines. A method for testing the semiconductor memory includes storing a high binary logic voltage level (high logic level) concurrently onto each memory cell in a particular row of memory cells controlled by a particular word line. Reading functional memory cells causes voltage perturbations on corresponding bit lines which are amplified into a high logic level. Reading faulty memory cells causes voltage perturbations on corresponding bit lines which are amplified into a low binary logic voltage level (low logic level). Bit lines are concurrently coupled onto corresponding data lines which are precharged to a high logic level. Those data lines coupled to bit lines which are in turn coupled to faulty memory cells are discharged through bit line test devices having a unidirectional conduction property. The resulting voltage on the discharged data lines, which is lower than its precharged logic high voltage, is detected. In this way, a faulty memory cell in a particular row of memory cells is identified.

Similarly, a low binary logic voltage level is concurrently stored onto each memory cell in a particular row of memory cells controlled by a particular word line. Reading functional memory cells causes voltage perturbations on corresponding bit lines which are amplified into a low logic level. Reading faulty memory cells causes voltage perturbations on corresponding bit lines which are amplified into a high logic level on the bit line, and a low logic level on its corresponding complementary bit line. Those data lines coupled to complementary bit lines having a low logic level are discharged through bit line test devices having a unidirectional conduction property. The resulting voltage on the discharged complementary data lines, which is lower than its precharged logic high voltage, is detected. In this way, a faulty memory cell in a particular row of memory cells is identified.

Since a row of memory cells can be concurrently written, and concurrently tested for the presence of a faulty memory cell, the number of times the memory array is required to be accessed during test is greatly reduced. As a result, test time is also greatly reduced.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
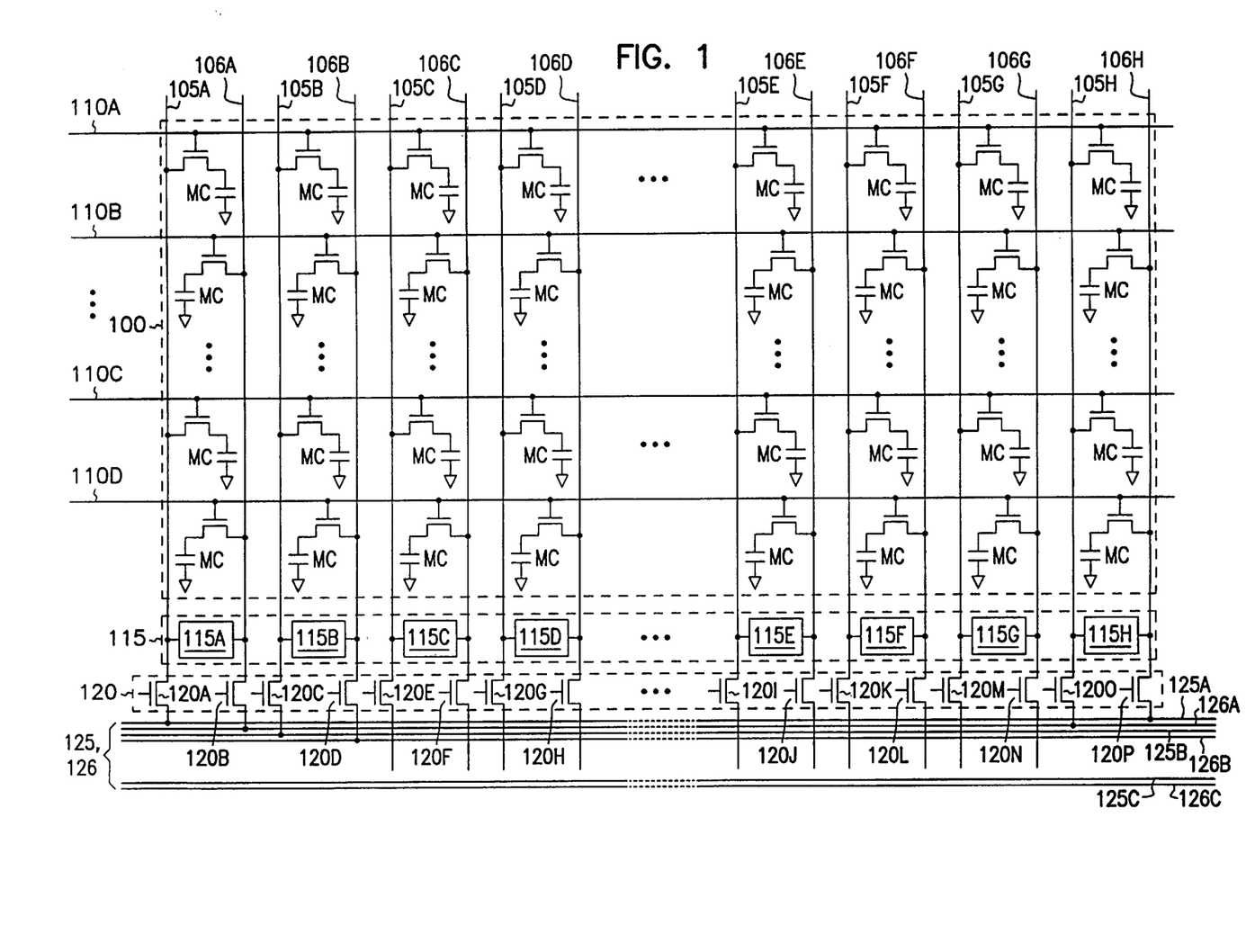
FIG. 1 illustrates generally a portion of a dynamic random access memory (DRAM) array including memory cells, word lines, bit lines, bit line access field-effect transistors (FETs), and data lines.

FIG. 1 illustrates generally one embodiment of a portion of a dynamic random access memory (DRAM) array. A memory cell array 100 is illustrated generally, comprising individual memory cells each designated as MC. Each memory cell is comprised of a memory cell storage capacitor and a cell access field effect transistor (FET).

In FIG. 1, the gate terminals of the cell access FETs are each coupled to one of word lines 110A–D, generally designated 110. Word lines 110 are controlled by a row decoder that activates a particular word line determined by a row address. The storage capacitor stores binary data as a quantity of charge. The cell access FETs act as switches to transfer charge between the storage capacitors and their respective bit lines 105, 106. Each memory cell is coupled to either a true bit line 105A–H or a complementary bit line 106A–H. The true and complementary bit lines are referred to generally as bit lines 105, 106.

In FIG. 1, the cell access FET acts as a switch having two states. The particular state of the cell access FET is determined by a control voltage at a gate terminal of the cell access FET. In one state, the cell access FET electrically couples the memory cell storage capacitor to a bit line 105, 106. In the other state, the cell access FET electrically isolates the memory cell storage capacitor from the bit line 105, 106. In FIG. 1, dotted lines indicate generally other instantiations of memory cells and bit lines which are not illustrated in FIG. 1.

In reading data from a particular memory cell, a voltage difference is sensed by one of sense amplifiers 115A–H, collectively 115, between a true bit line 105 to which the particular memory cell is coupled and a corresponding complementary bit line 106. For example, in reading data from a memory cell coupled to bit line 105A, sense amplifier 115A senses a voltage difference between bit line 105A and corresponding complementary bit line 106A, as set forth below.

First, bit line 105A and its corresponding complementary bit line 106A are equilibrated. A substantially equal voltage is created on the bit line 105A and its corresponding complementary bit line 106A. Next, a voltage is delivered to word line 110A to activate each memory access transistor having a gate terminal connected to word line 110A. Since no memory access transistor having a gate terminal connected to word line 110A is connected to a complementary bit line 106 these complementary bit lines 106 remain isolated from their corresponding memory cells. Of the activated memory access transistors, a single memory access transistor couples a memory cell storage capacitor onto bit line 105A.

Referring exclusively to true bit line 105A and corresponding complementary bit line 106A, by way of example, charge is transferred between a single memory cell capacitor and true bit line 105A, thereby perturbing the voltage on true bit line 105A. The resulting small voltage differential between true bit line 105A and complementary bit line 106A is sensed by sense amplifier 115A coupled between true bit line 105A and complementary bit line 106A. Sense amplifier 115A further separates this voltage difference between true bit line 105A and complementary bit line 106A.

Data may analogously be read from memory cells coupled to a complementary bit line 106 by activating a word line 110 which couples memory cells onto a complementary bit line 106. For example, by activating word line 110B (FIG. 1), data is coupled onto complementary bit lines 106A–H.

In FIG. 1, true bit lines 105 can be selectively coupled to true data lines 125A–C, generally designated 125, through a corresponding FET of bit line access FETs 120A–P, generally designated 120. In FIG. 1, complementary bit lines 106 can be selectively coupled to complementary data lines 126A–C, generally designated 126, through a corresponding FET of bit line access FETs 120.

Figure 2:
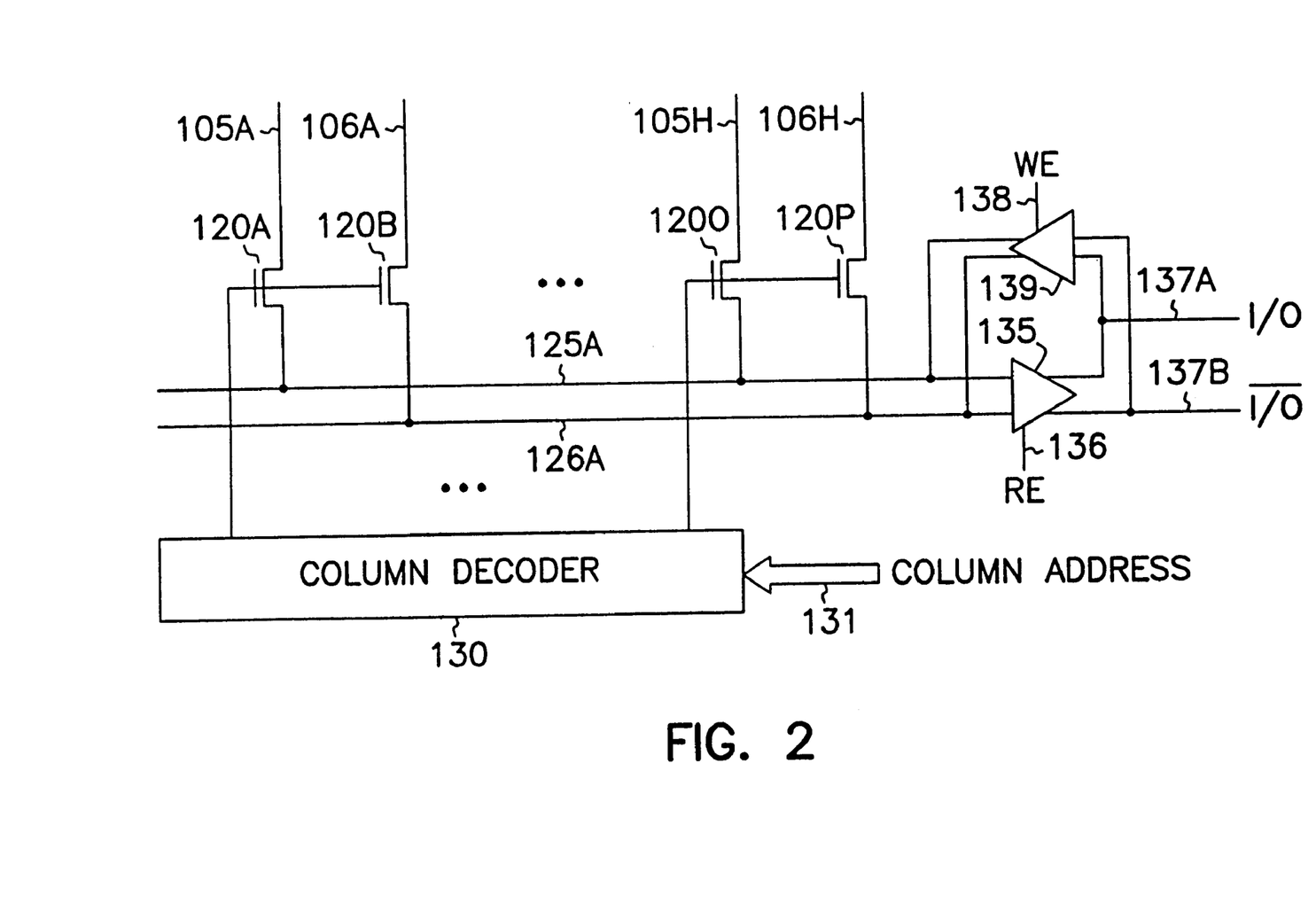
FIG. 2 illustrates generally a portion of the DRAM of FIG. 1 with added circuits including a read amplifier, write amplifier, and a column decoder.

FIG. 2 shows only a portion of the view of FIG. 1, along with some additional circuitry. Only four bit lines 105A, 106A, 105H, and 106H are shown, along with corresponding bit line access FETs 120A, 120B, 120O, and 120P respectively. Bit line access FETs 120A and 120O couple true bit lines 105A and 105H respectively to true data line 125A. Bit line access FETs 120B and 120P couple complementary bit lines 106A and 106H respectively to complementary data line 126A.

In FIG. 2, column decoder 130 ensures that only one bit line 105, 106 is coupled to its corresponding data line 125 during a normal read operation. A column address 131 determines which bit line 105, 106 is coupled to its corresponding data line 125, 126 during a normal read operation. Column decoder 130 is connected to pairs of gate terminals of bit line access FETs 120A, 120B, 120O, 120P acting as switches. A voltage delivered by the column decoder controls a switch resistance of each bit line access FET 120A, 120B, 120O, 120P to either electrically couple or electrically isolate each bit line 105A, 106A, 105H, 106H from a data line 125A, 126A.

In FIG. 2, during a normal read operation, a word line 110 (FIG. 1) turns on a memory cell access FET, thereby coupling a charge stored on a memory cell storage capacitor onto a bit line 105, 106. A sense amplifier 115 (FIG. 1) detects the resulting small voltage differential between the true bit line 105 and a corresponding complementary bit line 106. The sense amplifier 115 (FIG. 1) also further separates this resulting small voltage differential between the true bit line 105 and its corresponding complementary bit line 106.

In FIG. 2, a column decoder 130 activates certain bit line access FETs 120 which couples a true bit line 105 to a true data line 125A and substantially concurrently couples its corresponding complementary bit line 106 to a complementary data line 126A. The true data line 125A and complementary data line 126A are coupled to the inputs of read amplifier 135, which provides a true logic output at true input/output 137A and a binary complement logic output at complementary input/output 137B when enabled by read enable signal 136.

For example, during a normal read operation of data on true bit line 105A, column decoder 130 turns on both bit line access FETs 120A and 120B, thereby coupling true bit line 105A to true data line 125A and also coupling complementary bit line 106A to complementary data line 126A. The voltage difference between true data line 125A and complementary data line 126A is sensed by read amplifier 135, and converted to a true logic level at true input/output 137A and a binary complement logic level at complementary input/output 137B.

Data can also be written onto data lines 125, 126 and transferred onto the bit lines 105, 106. For example, during a normal write operation, the read enable signal 136 disables the read amplifier, and a write enable signal 138 enables a write amplifier 139 to write a data bit onto true data line 125A, and a binary complement data bit onto complementary data line 126A. Column decoder 130 turns on both bit line access FETs 125A and 125B, thereby coupling the data bit on true data line 125A onto true bit line 105A, and also coupling the binary complement data bit on complementary data line 126A onto complementary bit line 106A.

It is understood that FIG. 2 only partially illustrates the intercoupling between the data lines 125, 126 and bit lines 105, 106. In particular, other instantiations of data lines 125, 126 omitted from FIG. 2 are analogously coupled to other instantiations of bit lines 105, 106. These other instantiations of data lines 125, 126 have corresponding other instantiations of read amplifiers 135, write amplifiers 139, true input/outputs 137A, and complementary input/outputs 137B.

Figure 3:
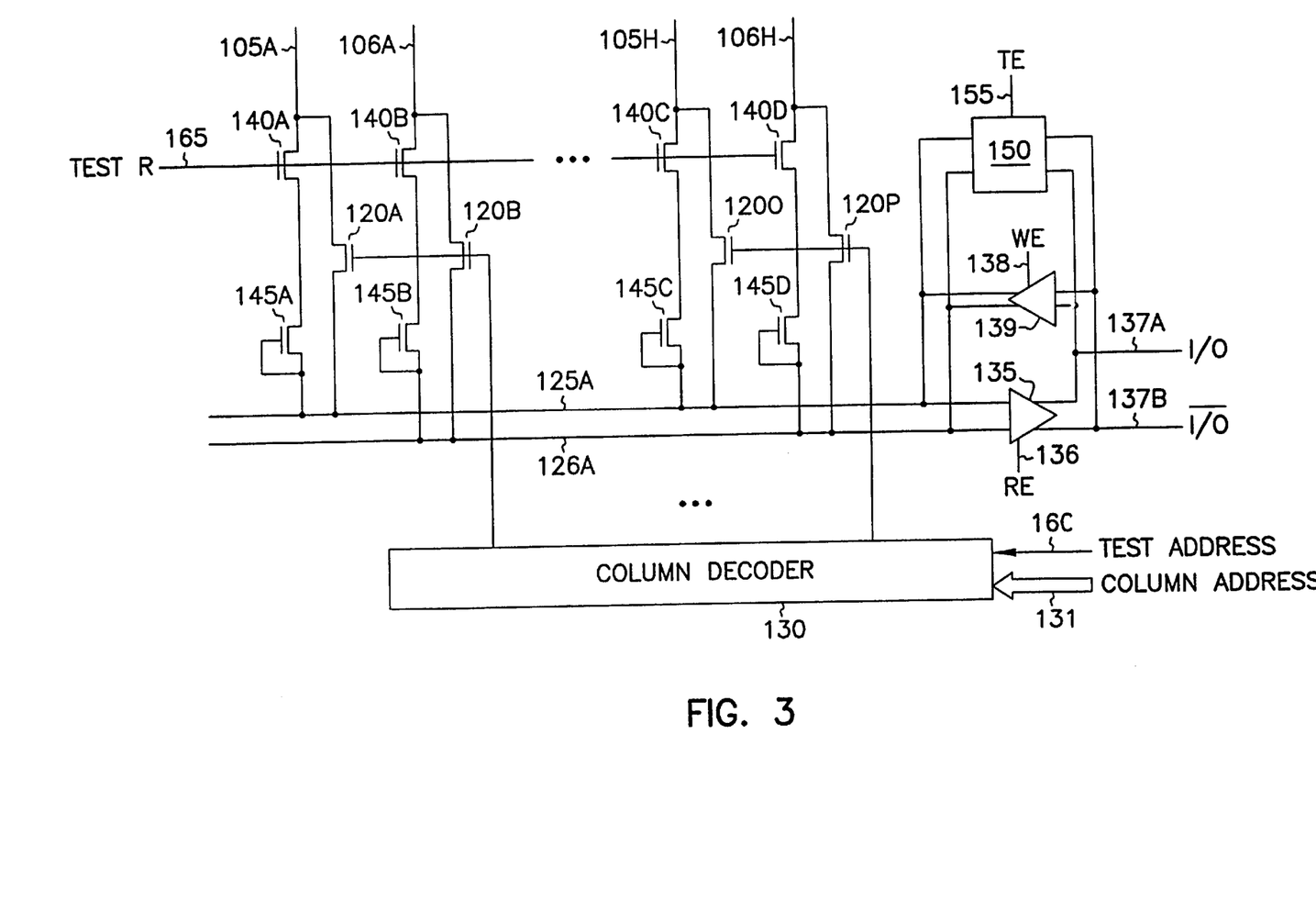
FIG. 3 illustrates generally the portion of the DRAM of FIG. 2, with added circuits including a test access FETs, diode-connected FETs, and a test read amplifier.

FIG. 3 illustrates the view of FIG. 2 with some additional circuitry. In FIG. 3, each bit line 105, 106 is coupled to a corresponding data line 125, 126 not only by a bit line access FET 120, but also by a parallel path consisting of a test access FET 140A, 140B, 140O, 140P, generally 140, each in series with a bit line test device having a unidirectional current conduction property. In the embodiment of FIG. 3, each bit line test device comprises a diode-connected FET 145A, 145B, 145C, 145D, generally 145, having a unidirectional current conduction property. For example, bit line access FET 120A has a parallel path consisting of test access FET 140A in series with diode-connected FET 145A. It is understood that other bit line test devices having a unidirectional current conduction property may also be analogously used without changing the scope and spirit of the present invention. For example, a pn junction diode could also be used instead of the diode-connected FET 145.

In FIG. 3, the data lines 125A and 126A are coupled not only to inputs of read amplifier 135 and outputs of write amplifier 139, but also to the inputs of test read circuit 150. Test read circuit 150 is separately enabled by test enable signal 155. Column decoder 130 has a separate test address signal 160. When test address signal 160 is enabled, column decoder 130 enables all bit line access transistors 120 for concurrent reading and writing of all bit lines 105, 106.

The present invention advantageously allows all memory cells controlled by a single word line 110 (FIG. 1) to be tested concurrently, thereby reducing required testing time. All memory cells controlled by a single word line 110 are concurrently written to an identical binary data value which is placed on each input/output 137. Each write amplifier 139 coupled to each pair of data lines 125 is enabled by its write enable signal 138, coupling the identical binary data value from each input/output 137A onto each true data line 125 and coupling identically complementary data values from each complementary input/output 137B onto each complementary data line 126. The test address signal 160 enables the column decoder 130 to turn on all bit line access FETs 120 concurrently, coupling the identical data values from the true data lines 125 onto the true bit lines 105, and also coupling the identically complementary data values from the complementary data lines 126 onto the complementary bit lines of bit lines 106.

Activating a particular word line 110 couples memory cells to either a true bit line 105, thereby storing an identical binary data value in the memory cells controlled by the particular word line 110, or couples memory cells to a complementary bit line 106, storing an identical complementary data value in the memory cells controlled by the particular word line. The particular word line 110, the bit line access FETs 120, and the write enable 138 are then all deactivated. After a short delay, all the memory cells controlled by the particular word line 110 have their functionality concurrently tested.

Detecting Cells Improperly Storing a Logic "1"

Failing memory cells which are stuck at zero can be detected using a word line wide test as described below. To concurrently test all memory cells controlled by a particular word line 110 for a stuck at zero fault, a high binary logic voltage level (high logic level) is first written into these memory cells. All data lines 125, 126 are precharged to a high logic level. Each pair of true bit lines 105 and complementary bit lines 106 is equilibrated to the same voltage. The particular word line 110 is then activated, thereby coupling a charge onto either the true bit lines 105, or the complementary bit lines 106. The following description assumes a word line 110 which couples charge onto the true bit line 105. It is understood that circuits and methods described are equally applicable to a word line 110 which couples charge onto the complementary bit line 106. For each functional memory cell, a small positive voltage differential is created between its true bit line 105 and its corresponding complementary bit line 106. For each faulty memory cell, a small negative voltage differential is created between its true bit line 105 and its corresponding complementary bit line 106.

The sense amplifiers 115 detect the differential voltage between each true bit line 105 and its corresponding complementary bit line 106, and further separates the difference between these two voltages. For each functional memory cell coupled to a true bit line 105, a high logic level results on its true bit line 105, and a low binary logic voltage level (low logic level) results on its complementary bit line 106. For each faulty memory cell coupled to a true bit line 105, a low logic level results on its true bit line 105, and a high logic level results on its complementary bit line 106.

The test access FETs 140 are then activated by the TESTR signal 165. Any bit line 105, 106 having a low logic level discharges its corresponding data line 125, 126 through its corresponding diode-connected FET 145. The corresponding data line 125, 126 is discharged from its precharged high logic level to a FET threshold voltage above the low logic level. Low logic levels on complementary bit lines 106 resulting from functional memory cells coupled to true bit lines 105 will discharge all complementary data lines 126 through corresponding diode-connected FETs 145. These complementary data lines 126 are discharged to a FET threshold voltage above the low logic level. If the memory cells coupled onto the true bit lines 105 are all functional, then the true bit lines 105 are all at a high logic level, and the corresponding true data line 125 is not discharged through a corresponding diode-connected FET 145. However, if one of the memory cells coupled to a true bit line 105 is faulty, it produces a low logic level on its true bit line 105, thereby discharging its corresponding true data line 125 to a FET threshold voltage above the low logic level.

Referring to FIG. 3 by way of example, for a functional memory cell coupled to true bit line 105A by a cell access FET controlled by word line 110A, sense amplifier 115A delivers a high logic level at true bit line 105A and a low logic level at complementary bit line 106A. Similarly, all other true bit lines 105 having functional memory cells, such as true bit line 105H, will have a high logic level delivered by its corresponding sense amplifier 115. All other complementary bit lines 106 having functional memory cells, such as complementary bit line 106H, will have a low logic level delivered by its corresponding sense amplifier 115. Test access FETs 140 are activated by the TESTR signal 165. For functional memory cells, complementary bit lines 106A and 106H will each have a low logic level, thereby discharging precharged complementary data line 126A through diode-connected FETs 145B and 145D to a voltage which is more positive than the low logic level by a FET threshold voltage. Since true bit lines 105A and 105H will remain at a high logic level for functional memory cells, true data line 125A will remain at a high logic level as well.

For a faulty memory cell coupled onto true bit line 105A by a cell access FET controlled by word line 110A, a low logic level is delivered at true bit line 105A and a high logic level is delivered at complementary bit line 106A. When test access device 140A is activated by TESTR signal 165, true data line 125A is discharged to a voltage which is more positive than the low logic level on true bit line 105A by a FET threshold voltage. Reverse-biased diode-connected FET 145B prevents the high logic level on complementary bit line 106A, having a corresponding true bit line 105A coupled to a faulty memory cell, from charging complementary data line 126A toward a more positive voltage. Reverse-biased diode-connected FET 145C prevents the high logic level on true bit line 105H, coupled to a functional memory cell, from charging true data line 125A toward a more positive voltage.

Thus, a faulty memory cell will impose substantially equal logic levels on true data line 125A and complementary data line 126A, with these substantially equal logic levels being more positive than a low logic level by a FET threshold voltage. In one embodiment, these substantially equal logic levels can be detected by test read circuit 150, as described below. In another embodiment, test read circuit 150 compares the voltage on the true data line 125A and the complementary data line 126A to a reference voltage. This embodiment allows faster testing since the reference voltage can be set arbitrarily close to the precharged high value of the true data line 125A and complementary data line 126A. Thus, the true data line 125A and complementary data line 126A need not discharge completely to a voltage equal to the low logic level plus a FET threshold voltage. Instead, the true data line 125A and complementary data line 126A need only to discharge beyond the reference voltage in order for such a voltage change to be detected.

Detecting Cells Improperly Storing a Logic "0"

Failing memory cells which are stuck at one can be detected using a word line wide test as described below. To concurrently test all memory cells controlled by a particular word line 110 for a stuck at one fault, a low binary logic voltage level (low logic level) is first written into these memory cells. All data lines 125, 126 are precharged to a high logic level. Each pair of true bit lines 105 and complementary bit lines 106 is equilibrated to the same voltage. The particular word line 110 is then activated, thereby coupling a charge onto either the true bit lines 105, or the complementary bit lines 106. The following description assumes a word line 110 which couples charge onto the true bit line 105. It is understood that circuits and methods described are equally applicable to a word line 110 which couples charge onto the complementary bit line 106. For each functional memory cell, a small negative voltage differential is created between its true bit line 105 and its corresponding complementary bit line 106. For each faulty memory cell, a small positive voltage differential is created between its true bit line 105 and its corresponding complementary bit line 106.

The sense amplifiers 115 detect the differential voltage between each true bit line 105 and its corresponding complementary bit line 106, and further separates the difference between these two voltages. For each functional memory cell coupled to a true bit line 105, a low logic level results on its true bit line 105, and a high logic level results on its complementary bit line 106. For each faulty memory cell coupled to a true bit line 105, a high logic level results on its true bit line 105, and a low logic level results on its complementary bit line 106.

The test access FETs 140 are then activated by the TESTR signal 165. Any bit line 105, 106 having a low logic level discharges its corresponding data line 125, 126 through its corresponding diode-connected FET 145. The corresponding data line 125, 126 is discharged from its precharged high logic level to a FET threshold voltage above the low logic level. Low logic levels on true bit lines 105, resulting from functional memory cells coupled thereto, will discharge all true data lines 125 through corresponding diode-connected FETs 145. These true data lines 125 are discharged to a FET threshold voltage above the low logic level. If the memory cells coupled onto the true bit lines 105 are all functional, then the complementary bit lines 106 are all at a high logic level, and the complementary data lines 126 are not discharged through corresponding diode-connected FET 145. In this case, the complementary data lines 126 remain at their precharged high value. However, if one of the memory cells coupled to a true bit line 105 is faulty, it produces a high logic level on that true bit line 105 and a low logic level on its corresponding complementary bit line 106, thereby discharging its corresponding complementary data line 126 to a FET threshold voltage above the low logic level.

Referring to FIG. 3 by way of example, for a functional memory cell coupled to true bit line 105A by a cell access FET controlled by word line 110A, sense amplifier 115A delivers a low logic level at true bit line 105A and a high logic level at complementary bit line 106A. Similarly, all other true bit lines 105 having functional memory cells, such as true bit line 105H, will have a low logic level delivered by its corresponding sense amplifier 115. All other complementary bit lines 106 having functional memory cells, such as complementary bit line 106H, will have a high logic level delivered by its corresponding sense amplifier 115. Test access FETs 140 are activated by the TESTR signal 165. For functional memory cells, complementary bit lines 106A, 106H, and other complementary bit lines 106 will each have a high logic level, and complementary data line 126A is not discharged through diode-connected FETs 145B and 145D. Since true bit lines 105A and 105H will be at a low logic level for functional memory cells, true data line 125A is discharged to a voltage which is more positive than a low logic level by a FET threshold voltage.

For a faulty memory cell coupled onto true bit line 105A by a cell access FET controlled by word line 110A, a high logic level is delivered at true bit line 105A and a low logic level is delivered at complementary bit line 106A. When test access device 140B is activated by TESTR signal 165, complementary data line 126A is discharged to a voltage which is more positive than the low logic level by a FET threshold voltage. Reverse-biased diode-connected FET 145A prevents the high logic level on true bit line 105A from charging true data line 125A toward a more positive voltage. Reverse-biased diode-connected FET 145D prevents the high logic level on complementary bit line 106H, corresponding to a functional memory cell coupled to true bit line 105H, from charging complementary data line 126A toward a more positive voltage.

Thus, a faulty memory cell will impose substantially equal logic levels on true data line 125A and complementary data line 126A, with these substantially equal logic levels being more positive than a low logic level by a FET threshold voltage. In one embodiment, these substantially equal logic levels can be detected by test read circuit 150, as described below. In another embodiment, test read circuit 150 compares the voltage on the true data line 125A and the complementary data line 126A to a reference voltage. This embodiment allows faster testing since the reference voltage can be set arbitrarily close to the precharged high value of the true data line 125A and complementary data line 126A. Thus, the true data line 125A and complementary data line 126A need not discharge completely to a voltage equal to the low logic level plus a FET threshold voltage for detection. Instead, the true data line 125A and complementary data line 126A need only to discharge beyond the reference voltage in order for such a voltage change to be detected.

Figure 4:
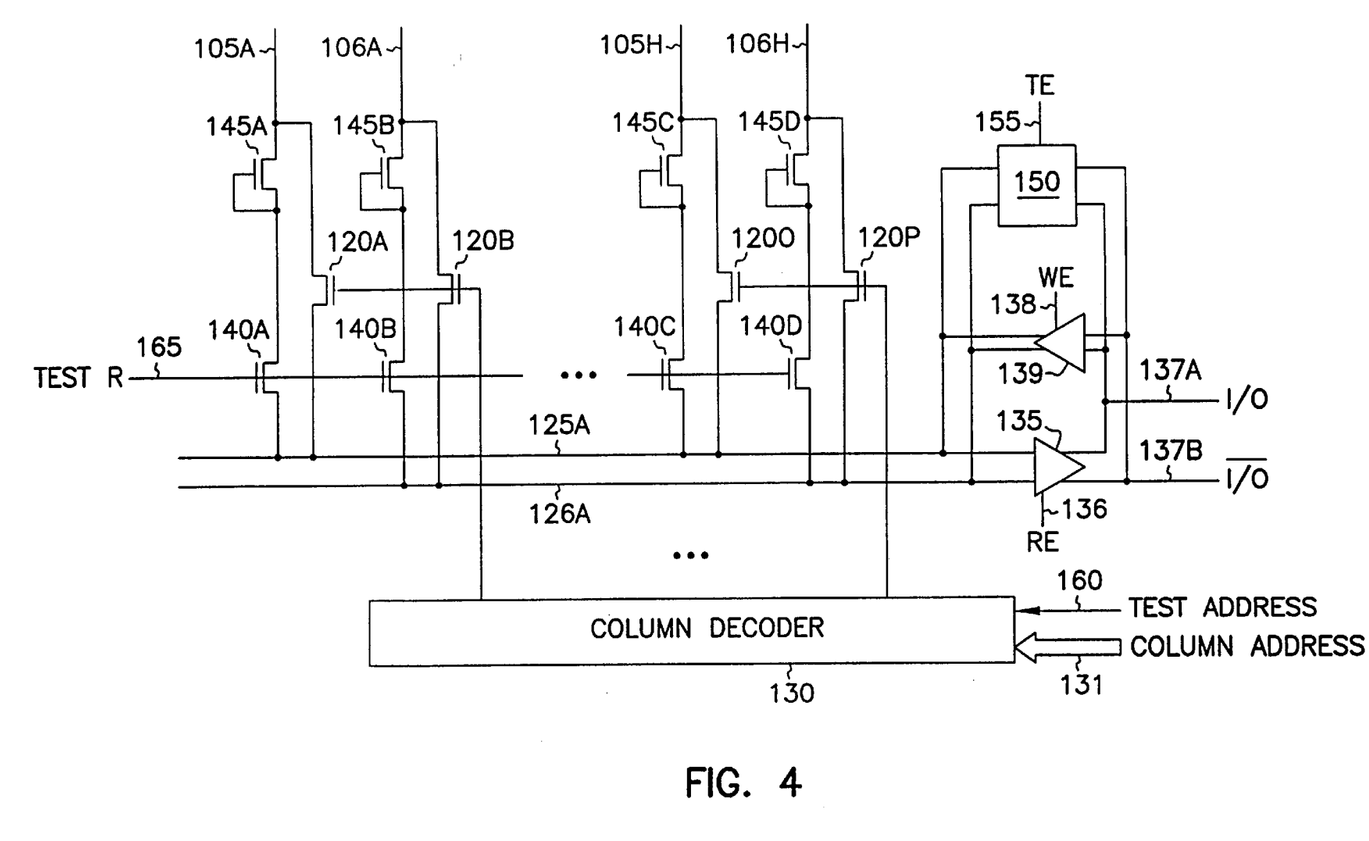
FIG. 4 illustrates generally an alternate embodiment of the portion of the DRAM of FIG. 3.

FIG. 4 illustrates generally an alternate embodiment of the invention as depicted in FIG. 3. In FIG. 3, each bit line 105, 106 is coupled to a corresponding data line 125, 126 not only by a bit line access FET 120, but also by a parallel path consisting of a test access FET 140 in series with a diode-connected FET 145. In FIG. 3, the test access FET 140 is connected to a bit line 105, 106 and the diode-connected FET 145 is connected between the test access FET 140 and the corresponding data line 125, 126. In FIG. 4, the relative positions of the test access FET 140 and the diode-connected FET 145 are interchanged such that the diode-connected FET 145 is connected to a bit line 105, 106 and the test access FET 140 is connected between the diode-connected FET 145 and the data line 125, 126. In FIG. 4, test access FET 140 still acts to prevent the bit line 105, 106 from coupling to the data line 125, 126 through diode-connected FET 145 except during a test read operation.

Figure 5:
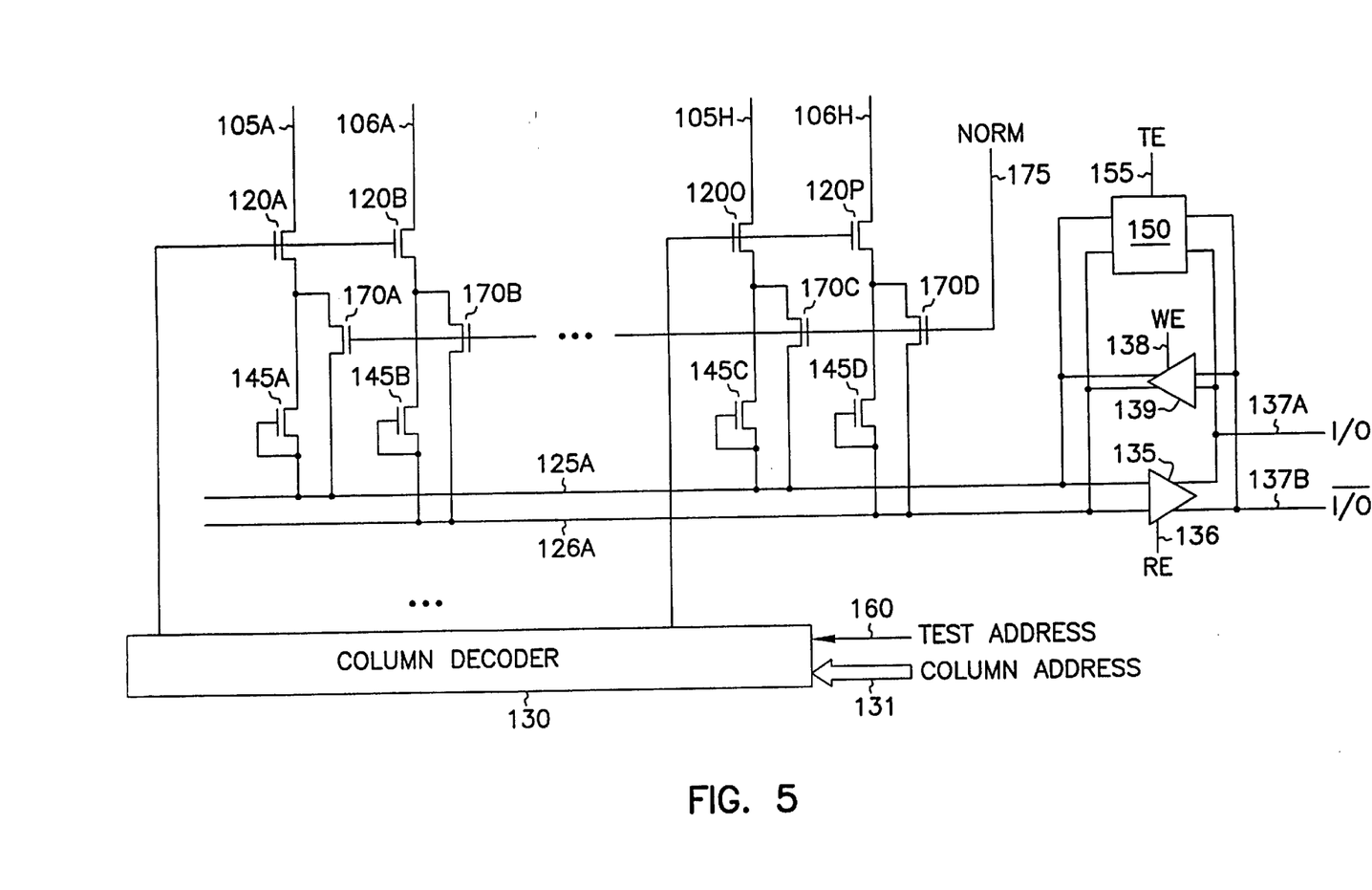
FIG. 5 illustrates generally an alternate embodiment of the portion of the DRAM of FIG. 3.

FIG. 5 illustrates generally an alternate embodiment of the invention as depicted in FIG. 3. In FIG. 3, each bit line 105, 106 is coupled to a corresponding data line 125, 126 not only by a bit line access FET 120, but also by a parallel path consisting of a test access FET 140 in series with a diode-connected FET 145. In FIG. 5, there is no parallel path for bit line access FETs 120. Instead, in FIG. 5 the diode connected FETs 145 are connected in series with the bit line access FETs 120. The test access FETs 140 of FIG. 3 are replaced by diode bypass FETs 170A, 170B, 170C, 170D, generally designated as 170. Diode bypass FETs 170 act as switches having a common gate terminal controlled by a signal NORM 175. Use of the embodiment illustrated in FIG. 5 differs slightly from use of the embodiment of FIG. 3. In FIG. 5, diode bypass FETs 170 are enabled during normal read and write operations and during a test write operation, thereby shorting out and bypassing corresponding diode-connected FETs 145 which appear in parallel with the diode bypass FETs 170. During a test read operation, the NORM signal 175 acts to disable the diode bypass FETs 170, thereby allowing bit lines 105, 106 having low logic levels to discharge the corresponding data line 125, 126 to which they are coupled. The resulting voltage on the corresponding data line 125, 126 is a FET threshold voltage above the low logic level.

Figure 6:
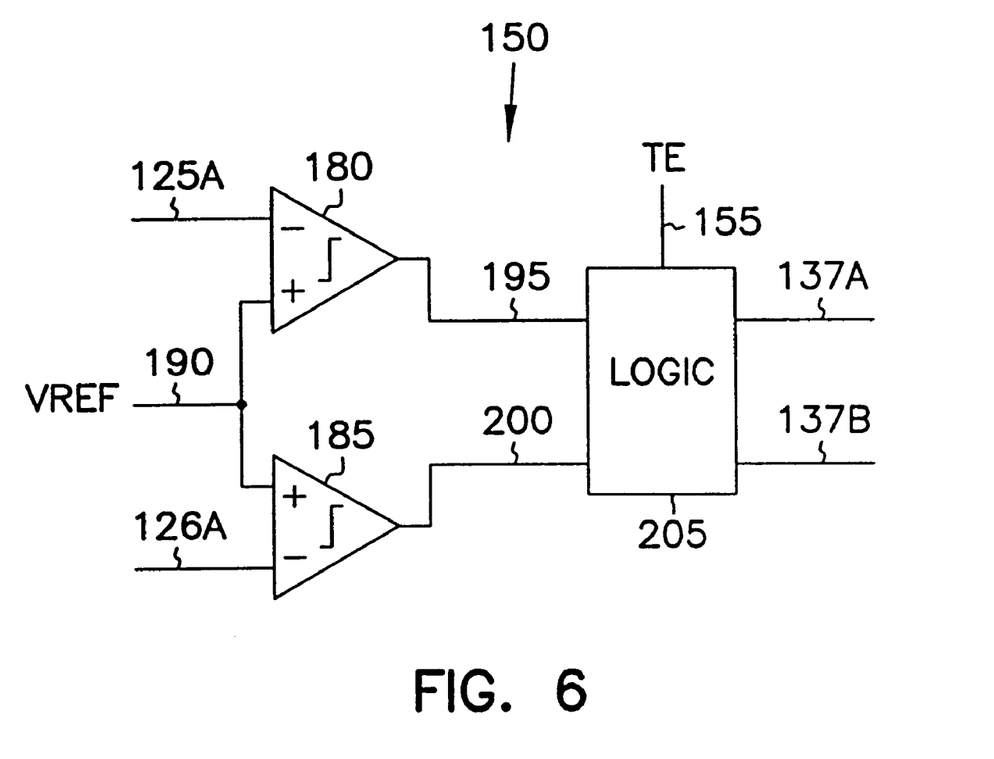
FIG. 6 illustrates generally one embodiment of a test read circuit.

One embodiment of test read circuit 150 is shown in FIG. 6. True data line 125A is coupled to the inverting input of comparator 180. Complementary data line 126 is coupled to the inverting input of comparator 185. Both comparators 180, 185 have their noninverting inputs coupled to a reference voltage VREF 190, which is arbitrarily close to the high logic level to which the data lines are precharged. Comparators 180, 185 operate such that when the data lines 125A and 126A are at the precharged high logic level, the comparator output 195 of comparator 180 and the comparator output 200 of comparator 185 are both at a logic low level. When the data line 125A, 126A is discharged through the diode-connected FET 145 to a voltage more negative than the reference voltage VREF 190, the comparator output 180, 200 delivers a high logic level input to logic circuit 205. Logic circuit 205, when enabled by test enable signal 155, delivers a true test output logic level to input/output 137A and a complementary output logic level to complementary input/output 137B.

It is recognized that other possible embodiments of the test read circuit 150 could also be used without departing from the scope and spirit of the present invention. For example, a single comparator could be used, with an input multiplexed between true data line 125A and complementary data line 126A.

Thus, the present invention advantageously allows all memory cells controlled by a single word line 110 (FIG. 1) to be tested concurrently, thereby reducing required testing time. Although detection of faulty memory cells coupled to true bit lines 105 has been described with particularity, it is understood that faulty memory cells coupled to complementary bit lines 106 can be analogously tested by activating a word line 110 controlling memory cells coupled to complementary bit lines 106. Although differential sensing between a true bit line 105 and a complementary bit line 106 has been described with particularity, it is understood that a single ended sensing technique could also be used without departing from the scope and spirit of the present invention. In particular, the present invention applies to a single ended sensing technique using a sense amplifier capable of providing a true output on a true data line, and a complementary output on a complementary data line.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the electrical, computer, and telecommunications arts will readily appreciate that the present invention may be implemented in a very wide variety of embodiments. This application is intended to cover any adaptations or variations of the preferred embodiment discussed herein. Therefore, it is manifestly intended that this invention be limited only by the claims and the equivalents thereof.

What is claimed is:

1. A method of testing a semiconductor memory having a memory cell, the method comprising the steps of:

storing a first logic level onto the memory cell;

initializing a data line to the first logic level;

reading data from the memory cell in which the first logic level was stored to obtain a resulting logic level;

unidirectionally coupling the resulting logic level to a data line;

allowing a second resulting logic level to change the logic state of the data line to which it is coupled; and detecting a logic level on the data line which is different from its initialized first logic level.

2. The method of claim 1, further comprising:

storing a second logic level onto the memory cell;

reading data from the memory cell in which the second logic level was stored; and obtaining a resulting logic level.

3. A method of testing a semiconductor memory having first and second memory cells, the first memory cell addressed by a first word line and accessed by a true bit line, the second memory cell addressed by a second word line and accessed by a complementary bit line, the true bit line coupled to a true data line through a first bit line access field-effect transistor (FET), the complementary bit line coupled to a complementary data line through a second bit line access FET, the method comprising the steps of:

storing a first logic level onto the first memory cell;

initializing the true and complementary data lines to a first logic level;

reading data from the first memory cell and, if the first memory cell is functional, amplifying a resulting voltage perturbation between the true and complementary bit lines into a first logic level on the true bit line and a second logic level on the complementary bit line and, if the first memory cell is faulty, amplifying a resulting voltage perturbation between the true and complementary bit lines into a second logic level on the true bit line and a first logic level on the complementary bit line;

unidirectionally coupling the true bit line to its corresponding true data line, allowing the true bit line having a second logic level to change a logic level of the true data line; and detecting a logic level on the true data line which is different from its initialized high logic level.

4. The method of claim 3, wherein detecting a logic level on the true data line further comprises comparing a logic output generated from a voltage on the true data line to another logic output generated from a voltage on the complementary data line.

5. The method of claim 3, further comprising:

storing a second logic level onto the first memory cell;

reading data from the first memory cell and, if the first memory cell is functional, amplifying a resulting voltage perturbation between the true and complementary bit lines into a second logic level on the true bit line and a first logic level the complementary bit line, otherwise, if the first memory cell is faulty, amplifying the resulting voltage perturbation between the true and complementary bit lines into a first logic level on the true bit line and a second logic level the complementary bit line;

unidirectionally coupling the complementary bit line to the complementary data line, allowing the complementary bit line having the second logic level to change the logic level of the complementary data line; and detecting a logic level on the complementary data line which is different from its initialized first logic level.

6. The method of claim 5, wherein detecting a logic level on the complementary data line further comprises comparing a logic output generated from a voltage on the complementary data line to another logic output generated from a voltage on the true data line.

7. A memory device, comprising:

a memory cell;

a true bit line, coupled to the memory cell;

a complementary bit line, coupled to the memory cell;

a true data line, coupled to the true bit line through a first switch, the first switch being controlled by a column decoder;

a complementary data line, coupled to the complementary bit line through a second switch, the second switch being controlled by the column decoder;

a field-effect transistor (FET) third switch, including first and second source/drains and a gate, the first source/drain of the third switch coupled to the true bit line, the gate of the third switch coupled to a test enable signal; and a first FET, including a first source/drain coupled to the second source/drain of the third switch, and a second source/drain of the first FET coupled to the true data line.

8. A memory device, comprising:

a memory cell;

a true bit line, coupled to the memory cell;

a complementary bit line, coupled to the memory cell;

a true data line, coupled to the true bit line through a first switch, the first switch being controlled by column decoder;

a complementary data line, coupled to the complementary bit line through a second switch, the second switch being controlled by the column decoder;

a field-effect transistor (FET) third switch, including first and second source/drains and a gate, the first source/drain of the third switch coupled to the true bit line, the gate of the third switch coupled to a test enable signal;

a first FET, including a first source/drain coupled to the second source/drain of the third switch, and a second source/drain of the first FET coupled to the true data line;

a FET fourth switch, including first and second source/drains and a gate, the first source/drain of the third switch coupled to the complementary bit line, the gate of the fourth switch coupled to the test enable signal; and a second FET, including a first source/drain coupled to the second source/drain of the fourth switch, and a second source/drain of the second FET coupled to the complementary data line.

9. A circuit, comprising:

first and second nodes communicating a first signal, the first node being coupled to the second node by:

a first FET, having a first source/drain coupled to the first node, a second source/drain coupled to the second node, and a gate receiving a first control signal;

a second FET, having a first source/drain coupled to the first node, a second source/drain, and a gate receiving a second control signal; and a third FET, having a first source/drain coupled to the second source/drain of the second FET, a second source/drain coupled to the second node, and a gate coupled to the second node; and third and fourth nodes communicating a second signal, which is complementary to the first signal, the third node being coupled to the fourth node by:

a fourth FET, having a first source/drain coupled to the third node, a second source/drain coupled to the fourth node, and a gate receiving the first control signal;

a fifth FET, having a first source/drain coupled to the third node, a second source/drain, and a gate receiving the second control signal; and a sixth FET, having a first source/drain coupled to the second source/drain of the fifth FET, a second source/drain coupled to the fourth node, and a gate coupled to the fourth node.

10. The circuit of claim 9, further including a column decoder providing the first control signal.

11. The circuit of claim 10, further including a test enable circuit providing the second control signal.

12. A memory device, comprising:

a memory cell;

a true bit line, coupled to the memory cell;

a complementary bit line, coupled to the memory cell;

a true data line, coupled to the true bit line through a first switch, the first switch being controlled by column decoder;

a complementary data line, coupled to the complementary bit line through a second switch, the second switch being controlled by the column decoder;

a field-effect transistor (FET) third switch, including first and second source/drains and a gate, the first source/drain of the third switch coupled to the true bit line, the gate of the third switch coupled to a test enable signal; and a diode-type device interposed between the second source/drain of the third switch and the true data line.

13. A memory device, comprising:

a memory cell;

a true bit line, coupled to the memory cell;

a complementary bit line, coupled to the memory cell;

a true data line, coupled to the true bit line through a first switch, the first switch being controlled by column decoder;

a complementary data line, coupled to the complementary bit line through a second switch, the second switch being controlled by the column decoder;

a field-effect transistor (FET) third switch, including first and second source/drains and a gate, the first source/drain of the third switch coupled to the true data line, the gate of the third switch coupled to a test enable signal; and a first FET, including a first source/drain coupled to the second source/drain of the third switch, and a second source/drain of the first FET coupled to the true bit line.

14. A memory device, comprising:

a memory cell;

a true bit line, coupled to the memory cell;

a complementary bit line, coupled to the memory cell;

a true data line, coupled to the true bit line through a first switch, the first switch being controlled by a column decoder;

a complementary data line, coupled to the complementary bit line through a second switch, the second switch being controlled by the column decoder;

a field-effect transistor (FET) third switch, including first and second source/drains and a gate, the first source/drain of the third switch coupled to the true data line, the gate of the third switch coupled to a test enable signal;

a first FET, including a first source/drain coupled to the second source/drain of the third switch, and a second source/drain of the first FET coupled to the true bit line;

a FET fourth switch, including first and second source/drains and a gate, the first source/drain of the third switch coupled to the complementary data line, the gate of the fourth switch coupled to the test enable signal; and a second FET, including a first source/drain coupled to the second source/drain of the fourth switch, and a second source/drain of the second FET coupled to the complementary bit line.

15. A circuit, comprising:

first and second nodes communicating a first signal, the first node being coupled to the second node by:
- a first FET, having a first source/drain coupled to the first node, a second source/drain coupled to the second node, and a gate receiving a first control signal;
- a second FET, having a first source/drain coupled to the second node, a second source/drain, and a gate receiving a second control signal; and
- a third FET, having a first source/drain coupled to the second source/drain of the second FET, a second source/drain coupled to the first node, and a gate coupled to the second source/drain of the second FET; and third and fourth nodes communicating a second signal, which is complementary to the first signal, the third node being coupled to the fourth node by:
- a fourth FET, having a first source/drain coupled to the third node, a second source/drain coupled to the fourth node, and a gate receiving the first control signal;
- a fifth FET, having a first source/drain coupled to the fourth node, a second source/drain, and a gate receiving the second control signal; and
- a sixth FET, having a first source/drain coupled to the second source/drain of the fifth FET, a second source/drain coupled to the third node, and a gate coupled to the second source/drain of the fifth FET.

16. The circuit of claim 15, further including a column decoder providing the first control signal.

17. The circuit of claim 16, further including a test enable circuit providing the second control signal.

18. A memory device, comprising:

a memory cell;

a true bit line, coupled to the memory cell;

a complementary bit line, coupled to the memory cell;

a true data line, coupled to the true bit line through a first switch, the first switch being controlled by a column decoder;

a complementary data line, coupled to the complementary bit line through a second switch, the second switch being controlled by the column decoder;

a field-effect transistor (FET) third switch, including first and second source/drains and a gate, the first source/drain of the third switch coupled to the true data line, the gate of the third switch coupled to a test enable signal; and a diode-type device interposed between the second source/drain of the third switch and the true bit line.

19. A memory device, comprising:

a memory cell;

a true bit line, coupled to the memory cell;

a complementary bit line, coupled to the memory cell;

a true data line;

a complementary data line;

a first switch, having a first conduction terminal coupled to the true bit line, a second conduction terminal, and a control terminal, the control terminal being controlled by a column decoder;

a second switch, having a first conduction terminal coupled to the complementary bit line, a second conduction terminal, and a control terminal, the control terminal being controlled by the column decoder;

a third switch, having a first conduction terminal coupled to the second conduction terminal of the first switch, a second conduction terminal coupled to the true data line, and a control terminal that is enabled during a normal mode of operation and disabled during a test mode of operation;

a fourth switch, having a first conduction terminal coupled to the second conduction terminal of the second switch, a second conduction terminal coupled to the complementary data line, and a control terminal that is enabled during the normal operation and disabled during the test mode of operation;

a first diode-type device between the second conduction terminal of the first switch and the true data line; and a second diode-type device between the second conduction terminal of the second switch and the complementary data line.

20. A memory device, comprising:

a memory cell;

a true bit line, coupled to the memory cell;

a complementary bit line, coupled to the memory cell;

a true data line;

a complementary data line;

a first switch, having a first conduction terminal coupled to the true bit line, a second conduction terminal, and a control terminal, the control terminal being controlled by a column decoder;

a second switch, having a first conduction terminal coupled to the complementary bit line, a second conduction terminal, and a control terminal, the control terminal being controlled by the column decoder;

a third switch, having a first conduction terminal coupled to the second conduction terminal of the first switch, a second conduction terminal coupled to the true data line, and a control terminal that is enabled during a normal mode of operation and disabled during a test mode of operation;

a fourth switch, having a first conduction terminal coupled to the second conduction terminal of the second switch, a second conduction terminal coupled to the complementary data line, and a control terminal that is enabled during the normal operation and disabled during the test mode of operation;

a first field-effect transistor (FET), having a first source/drain coupled to the second conduction terminal of the first switch, a second source/drain coupled to the true data line, and a gate coupled to the true data line; and a second FET, having a first source/drain coupled to the second conduction terminal of the second switch, a second source/drain coupled to the complementary data line, and a gate coupled to the complementary data line.

21. A circuit, comprising:

first and second nodes communicating a first signal, the first node being coupled to the second node by:
- a first FET, having a first source/drain coupled to the first node, a second source/drain, and a gate receiving a first control signal;
- a second FET, having a first source/drain coupled to the second node, a second source/drain coupled to the second source/drain of the first FET, and a gate receiving a second control signal; and
- a third FET, having a first source/drain coupled to the second source/drain of the second FET, a second source/drain coupled to the second node, and a gate coupled to the second node; and third and fourth nodes communicating a second signal, which is complementary to the first signal, the third node being coupled to the fourth node by:
- a fourth FET, having a first source/drain coupled to the third node, a second source/drain, and a gate receiving the first control signal;
- a fifth FET, having a first source/drain coupled to the fourth node, a second source/drain coupled to the second source/drain of the fourth FET, and a gate receiving the second control signal; and
- a sixth FET, having a first source/drain coupled to the second source/drain of the fifth FET, a second source/drain coupled to the fourth node, and a gate coupled to the fourth node.

22. The circuit of claim 21, further including a column decoder providing the first control signal.

23. The circuit of claim 22, further including a test enable circuit providing the second control signal that is enabled during a normal mode of operation and disabled during a test mode of operation.

* * * * *